United States Patent

Asai et al.

[11] Patent Number: 6,150,831
[45] Date of Patent: Nov. 21, 2000

[54] TEST METHOD AND DEVICE FOR SEMICONDUCTOR CIRCUIT

[75] Inventors: Mikio Asai; Ryoichi Takagi, both of Tokyo, Japan

[73] Assignee: Mitsubishi Denki Kabushiki Kaisha, Tokyo, Japan

[21] Appl. No.: 08/990,800

[22] Filed: Dec. 15, 1997

[30] Foreign Application Priority Data

Jul. 10, 1997 [JP] Japan .................................. 9-185513

[51] Int. Cl.⁷ .................................................. G01R 31/28
[52] U.S. Cl. .................................. 324/765; 324/763
[58] Field of Search ................................ 324/765, 769, 324/763, 158.1; 714/736

[56] References Cited

U.S. PATENT DOCUMENTS

| | | | |
|---|---|---|---|
| 5,321,354 | 6/1994 | Ooshima et al. | 324/765 |
| 5,471,153 | 11/1995 | Martin | 324/765 |

FOREIGN PATENT DOCUMENTS 3-28781  2/1991  Japan .
8-160104  6/1996  Japan .

*Primary Examiner*—Ernest Karlsen
*Attorney, Agent, or Firm*—Burns, Doane, Swecker & Mathis, LLP

[57] ABSTRACT

A semiconductor test device capable of solving a problem of a conventional one in that in the resistance measurement of a semiconductor integrated circuit it was difficult for the measurement error due to contact resistance or wiring resistance to be limited within a desired amount. The present semiconductor test device includes, in a semiconductor integrated circuit having a first semiconductor switch functioning as a pullup resistor and a second semiconductor switch functioning as a pulldown resistor, a measuring circuit for bringing the first and second semiconductor switches into conduction at the same time in response to a signal fed from a control circuit, a voltage measuring circuit for measuring the voltage at a connecting point between the two semiconductor switches, and a current measuring circuit for measuring a through current flowing through the two semiconductor switches.

15 Claims, 7 Drawing Sheets

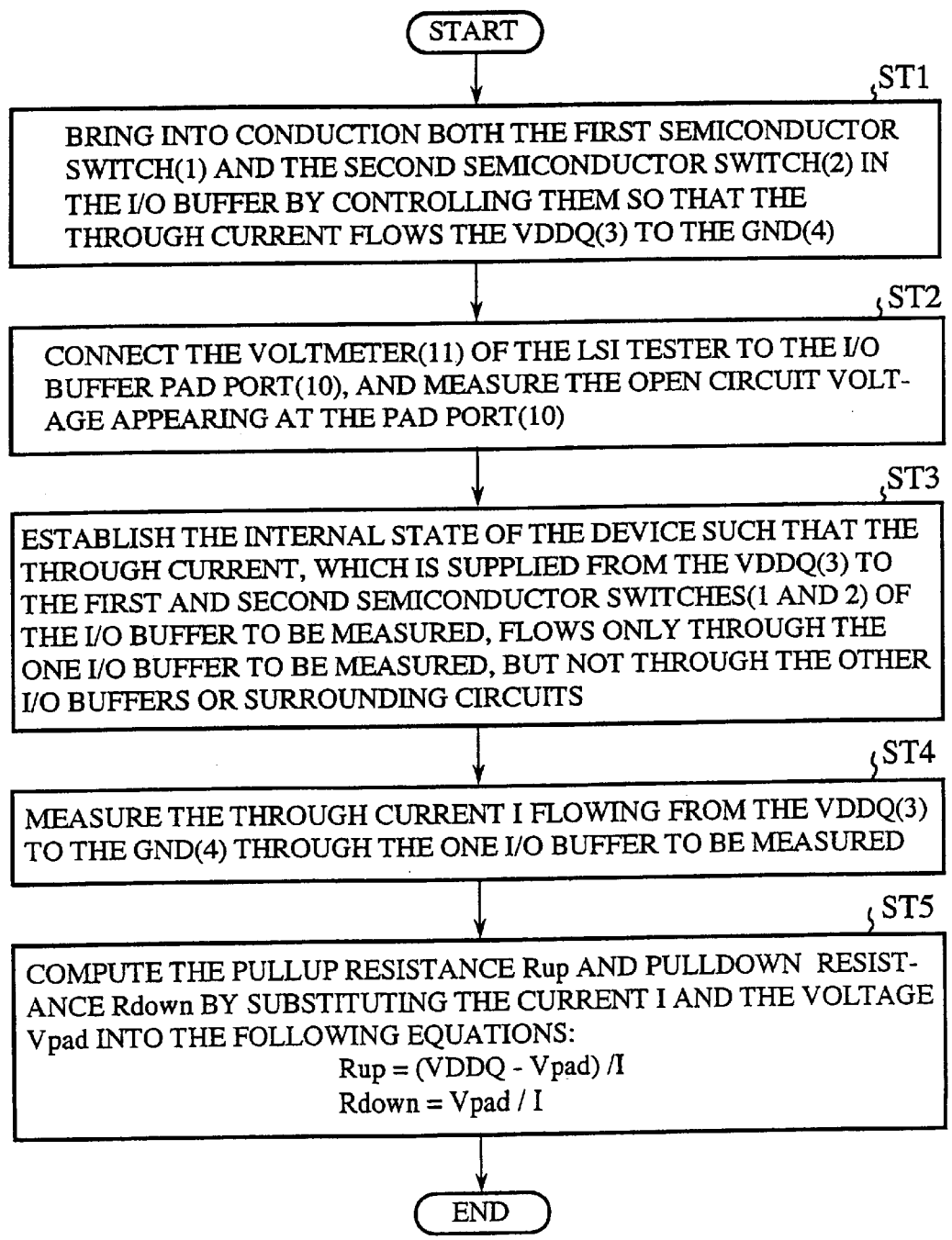

TEST METHOD AND DEVICE FOR SEMICONDUCTOR CIRCUIT

BACKGROUND OF THE INVENTION

1. Field of the Invention

The present invention relates to a test method and a test device for a semiconductor circuit which constitutes, for example, an input/output buffer for a fast, small signal of HSTL (High Speed Transistor Logic) including a first semiconductor switch functioning as a pullup resistor and a second semiconductor switch functioning as a pulldown resistor, which are connected in series.

2. Description of Related Art

FIG. 10 is a circuit diagram showing a conventional input/output buffer of a fast, small signal. In FIG. 10, the reference numeral 101 designates a transistor functioning as a pullup transistor, and 102 designates a transistor functioning as a pulldown transistor. The two transistors are connected in series, with the other end of the transistor 101 connected to a device power supply 103, and the other end of the transistor 102 connected to a ground 104.

The reference numeral 105 designates a differential amplifier for comparing a voltage of a pad 111 connected to a connecting point 106 between the transistor 101 and transistor 102 with a reference voltage applied to a reference voltage input pad 107.

The fast, small signal input/output buffer with the foregoing configuration, having the embedded resistors, the pullup resistor and pulldown resistor of a particular fixed amount (50 ohms, for example), transfers a signal by current driving. Since the variations of the embedded resistors have an effect on the voltage amplitude of the transferred signal, it is necessary to test the quality of the fast, small signal input/output buffer or the semiconductor circuit by measuring the value of the embedded resistors.

One of the conventional method of such measurement will be described with reference to FIG. 11. First, the voltage and current across the transistor 101 are obtained by bringing the transistor 101 into conduction and the transistor 102 out of conduction by control signals fed from the control circuit 108, and by measuring a voltage across a voltmeter 110 connected between the connecting point 106 and ground 104 while causing a current to flow in the direction indicated by the solid line arrow by connecting a current source 109 between the connecting point 106 and ground 104. Second, the voltage and current across the transistor 102 are obtained by bringing the transistor 102 into conduction and the transistor 101 out of conduction by the control signals fed from the control circuit 108, and by measuring a voltage across the voltmeter 110 while causing a current from the current source 109 to flow through the transistor 102 in the direction indicated by the dotted line arrow. The values of the pullup resistor and pulldown resistor are computed from the measured currents and voltages.

The conventional test method and device for the semiconductor circuit has a problem of causing a measuring error in the resistances obtained from the measured voltages and currents, of an amount corresponding to a plus minus few tens of milliamperes, and it is difficult to limit the measuring error within a desired value of plus minus ten milliamperes even when using a high accuracy tester. This is because the measurement of the voltages and currents suffers from the effect of a contact resistance between the device pads and probe-card pointers in a wafer test, or a resistance 112 consisting of a contact resistance between the package and socket and wiring resistances in a final test.

SUMMARY OF THE INVENTION

The present invention is implemented to solve the foregoing problem. It is therefore an object of the present invention to provide a test method and device for a semiconductor circuit capable of achieving high accuracy measurement of the pullup resistor and pulldown resistor embedded in the semiconductor circuit.

According to a first aspect of the present invention, there is provided a test method of a semiconductor circuit comprising the steps of: causing a through current to flow through a first semiconductor switch functioning as a pullup resistor and a second semiconductor switch functioning as a pulldown resistor, the first semiconductor switch and the second semiconductor switch being connected in series across a power supply and a ground in a circuit to be measured; measuring an open circuit voltage at a connecting point of the first semiconductor switch and the second semiconductor switch; and measuring the through current in a state that no current flows through circuits other than the circuit to be measured.

Here, the test method may further comprise the step of computing values of the pullup resistor and the pulldown resistor from the open circuit voltage and the through current.

According to a second aspect of the present invention, there is provided a test device of a semiconductor circuit comprising: a first semiconductor switch functioning as a pullup resistor; a second semiconductor switch functioning as a pulldown resistor, the first semiconductor switch and the second semiconductor switch being connected in series across a power supply and a ground in a circuit to be measured; means for bringing into conduction the first semiconductor switch and the second semiconductor switch at a same time; means for measuring an open circuit voltage at a connecting point of the first semiconductor switch and the second semiconductor switch; and means for measuring a through current flowing through the first semiconductor switch and the second semiconductor switch.

Here, the test device may further comprise means for computing values of the pullup resistor and the pulldown resistor from the open circuit voltage and the through current.

The first semiconductor switch and the second semiconductor switch may have different conductivity-types.

The first semiconductor switch and the second semiconductor switch may have an identical conductivity type.

The test device may further comprise means for generating a reference voltage varying stepwise, wherein the means for measuring an open circuit voltage may comprise a differential amplifier for comparing the reference voltage with the voltage at the connecting point of the first semiconductor switch and the second semiconductor switch, and means for storing the reference voltage when an output of the differential amplifier is inverted.

According to a third aspect of the present invention, there is provided a test device of a semiconductor circuit which includes a plurality of circuits to be measured, each of the plurality of circuits to be measured comprising: a first semiconductor switch functioning as a pullup resistor; a second semiconductor switch functioning as a pulldown resistor, the first semiconductor switch and the second semiconductor switch being connected in series across a power supply and a ground in a circuit to be measured; means for bringing into conduction the first semiconductor switch and the second semiconductor switch at a same time;

means for measuring an open circuit voltage at a connecting point of the first semiconductor switch and the second semiconductor switch; and means for measuring a through current flowing through the first semiconductor switch and the second semiconductor switch, wherein the test device further comprises means for sequentially providing each one of the plurality of circuits to be measured with a signal activating the means for bringing into conduction, and means for computing values of the pullup resistor and the pulldown resistor of each of the plurality of circuits to be measured from the open circuit voltage and the through current.

Here, the first semiconductor switch and the second semiconductor switch may have different conductivity types.

The first semiconductor switch and the second semiconductor switch may have an identical conductivity type.

The test device may further comprise means for generating a reference voltage varying stepwise, wherein the means for measuring an open circuit voltage may comprise a differential amplifier for comparing the reference voltage with the voltage at the connecting point of the first semiconductor switch and the second semiconductor switch, and wherein the test device may further comprise means for storing the reference voltage when an output of the differential amplifier is inverted.

BRIEF DESCRIPTION OF THE DRAWINGS

FIG. 2 is a flowchart illustrating a measuring operation of the embodiment 1;

DETAILED DESCRIPTION OF THE PREFERRED EMBODIMENTS

The invention will now be described with reference to the accompanying drawings.

EMBODIMENT 1

Figure 1:
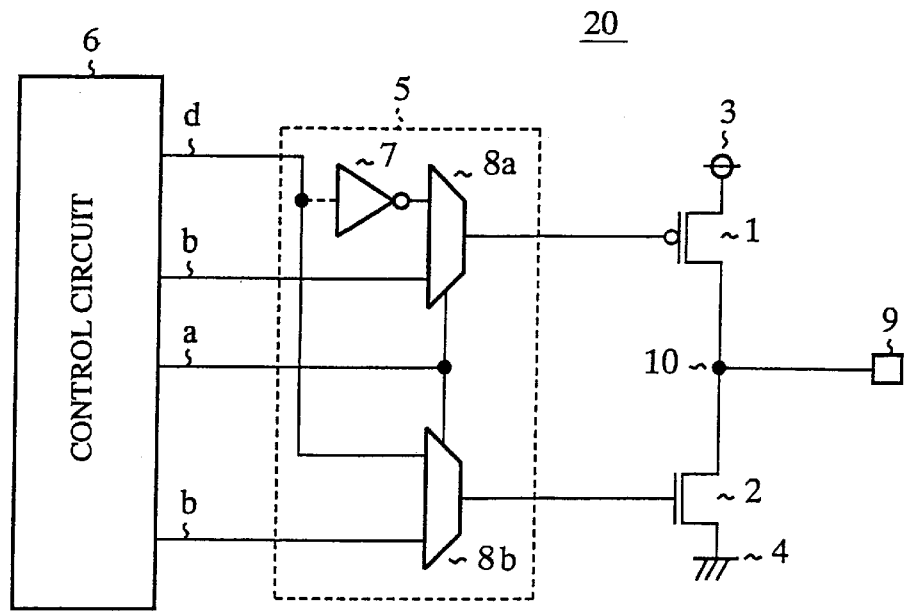
FIG. 1 is a circuit diagram showing an embodiment 1 of a fast, small signal input/output buffer in accordance with the present invention.

FIG. 1 is a circuit diagram showing an embodiment 1 of a fast, small signal input/output buffer 20 in accordance with the present invention. In FIG. 1, the reference numeral 1 designates a p-channel transistor, a first semiconductor switch functioning as a pullup resistor; and 2 designates an n-channel transistor, a second semiconductor switch functioning as a pulldown resistor. The two transistors are connected in series, and the other end of the transistor 1 is connected to a device power supply (power supply VDDQ) 3, and the other end of the transistor 2 is connected to a ground 4. The reference numeral 5 designates a measuring circuit for outputting a signal which brings both the transistor 1 and 2 into conduction at the same time in response to control signals fed from a control circuit 6. The measuring circuit 5 comprises an inverter 7 and two selectors 8a and 8b. The reference numeral 9 designates a pad connected to a connecting point (pad port) 10 between the transistors 1 and 2.

Next, the operation of the present embodiment 1 will be described with reference to the flowchart of FIG. 2.

At step ST1, a through current is caused to flow from the device power supply 3 to the ground 4 by bringing the transistors 1 and 2 into conduction by the signals delivered from the measuring circuit 5 in response to the control signals fed from the control circuit 6.

Figure 3:
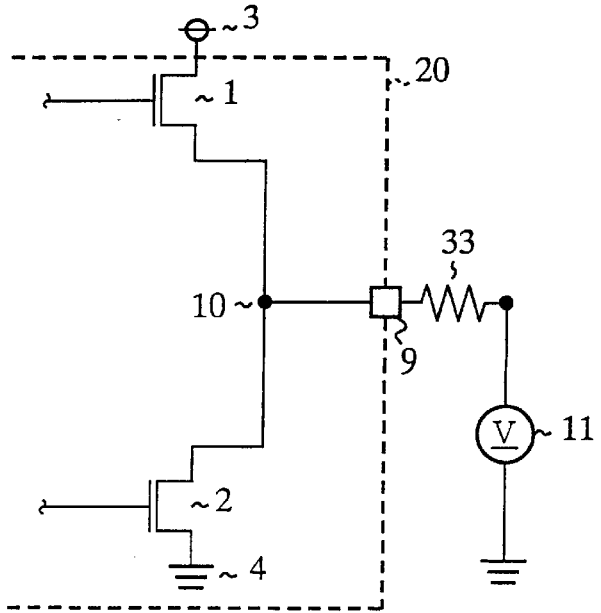
FIG. 3 is a circuit diagram illustrating a voltage measurement.

Afterward, at step ST2, a voltmeter (voltage measuring means) 11 is connected to the connecting point 10 between the transistors 1 and 2 as shown in FIG. 3 so that an open circuit voltage Vpad appearing at the connecting point 10 is measured, in which case a contact resistance 33 has only a negligible effect on the measurement of the open circuit voltage Vpad.

Subsequently, at step ST3, an internal state of the measuring circuit 5 is set such that the through current flowing out of the device power supply 3 and through the transistors 1 and 2 does not flow through circuits other than the circuit to be measured.

In this state, at step ST4, an ammeter (current measuring means) 12 is connected between the device power supply 3 and the series circuit of the transistors 1 and 2 so .that the through current is measured. In this case, since the device power supply 3 has multiple coupling pins for the power supply (not shown), the contact resistance is very small so that the measurement error of the ammeter 12 is negligible even if the through current flows through multiple buffers.

Afterward, at step ST5, the current I and the voltage Vpad thus measured are substituted into equations (1) to compute the pullup resistance Rup, and pulldown resistance Rdown.

$$Rup = (VDDQ - Vpad)/I$$
$$Rdown = Vpad/I \quad (1)$$

where VDDQ denotes a voltage of the device power supply 3.

According to the present embodiment 1, the through current is caused to flow from the device power supply 3 to the ground 4 by simultaneously bringing into conduction the transistors 1 and 2 functioning as the pullup resistor and pulldown resistor, respectively. This makes it possible to carry out the voltage and current measurements without suffering the effect of the wiring resistance or contact resistance. As a result, the pullup resistor and pulldown resistor can be computed accurately on the basis of the measured voltage and current.

EMBODIMENT 2

Figure 5:
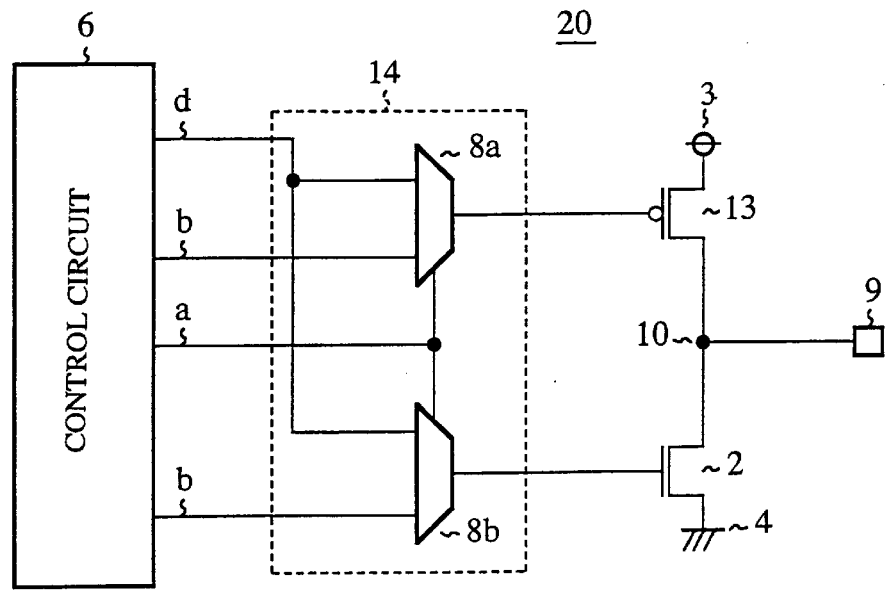
FIG. 5 is a circuit diagram showing an embodiment 2 of the fast, small signal input/output buffer in accordance with the present invention.

FIG. 5 is a circuit diagram showing a fast, small signal input/output buffer 20 as an embodiment 2 in accordance with the present invention. In FIG. 2, the reference numeral 13 designates an n-channel transistor, the same conductivity type as that of the transistor 2. The reference numeral 14 designates a measuring circuit including two selectors 8a and 8b for generating signals for bringing the transistors 2 and 13 into conduction at the same time.

The operation and the advantage of the present embodiment 2 are the same as those of the embodiment 1, and hence the description thereof is omitted here to avoid duplication.

According to the present embodiment 2, since the two transistors of the same conductivity type are connected in series, the measuring circuit 14 for simultaneously bringing the two transistors into conduction or out of conduction can be arranged simply using only the selectors.

EMBODIMENT 3

Figure 6:
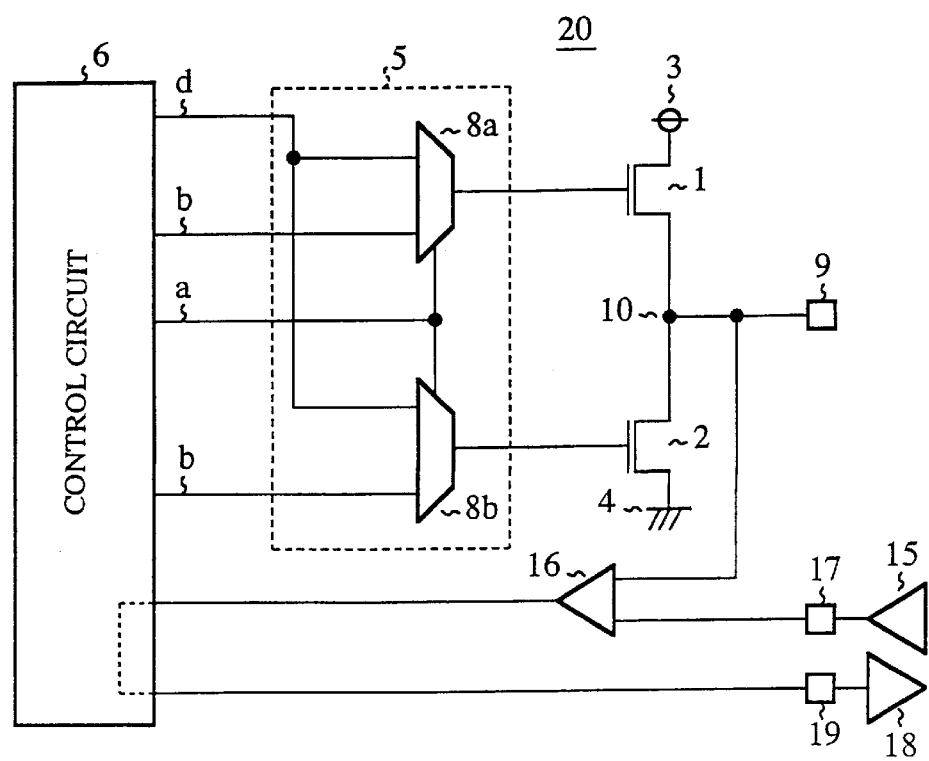
FIG. 6 is a circuit diagram showing an embodiment 3 of the fast, small signal input/output buffer in accordance with the present invention.

FIG. 6 is a circuit diagram showing an embodiment 3 of the fast, small signal input/output buffer in accordance with the present invention. In FIG. 6, the reference numeral 15 designates a test driver outputting a reference voltage varying stepwise; 16 designates a differential amplifier for comparing the voltage at the connecting point 10 with the reference voltage supplied from the test driver 15 through a reference voltage input pad 17; and 18 designates a tester comparator for detecting the output of the differential amplifier 16 through an output monitor pad 19. Since the remaining configuration is the same as that of the embodiment 1 shown in FIG. 1, the description thereof is omitted here by designating the corresponding portions by the same reference numerals.

Figure 7:
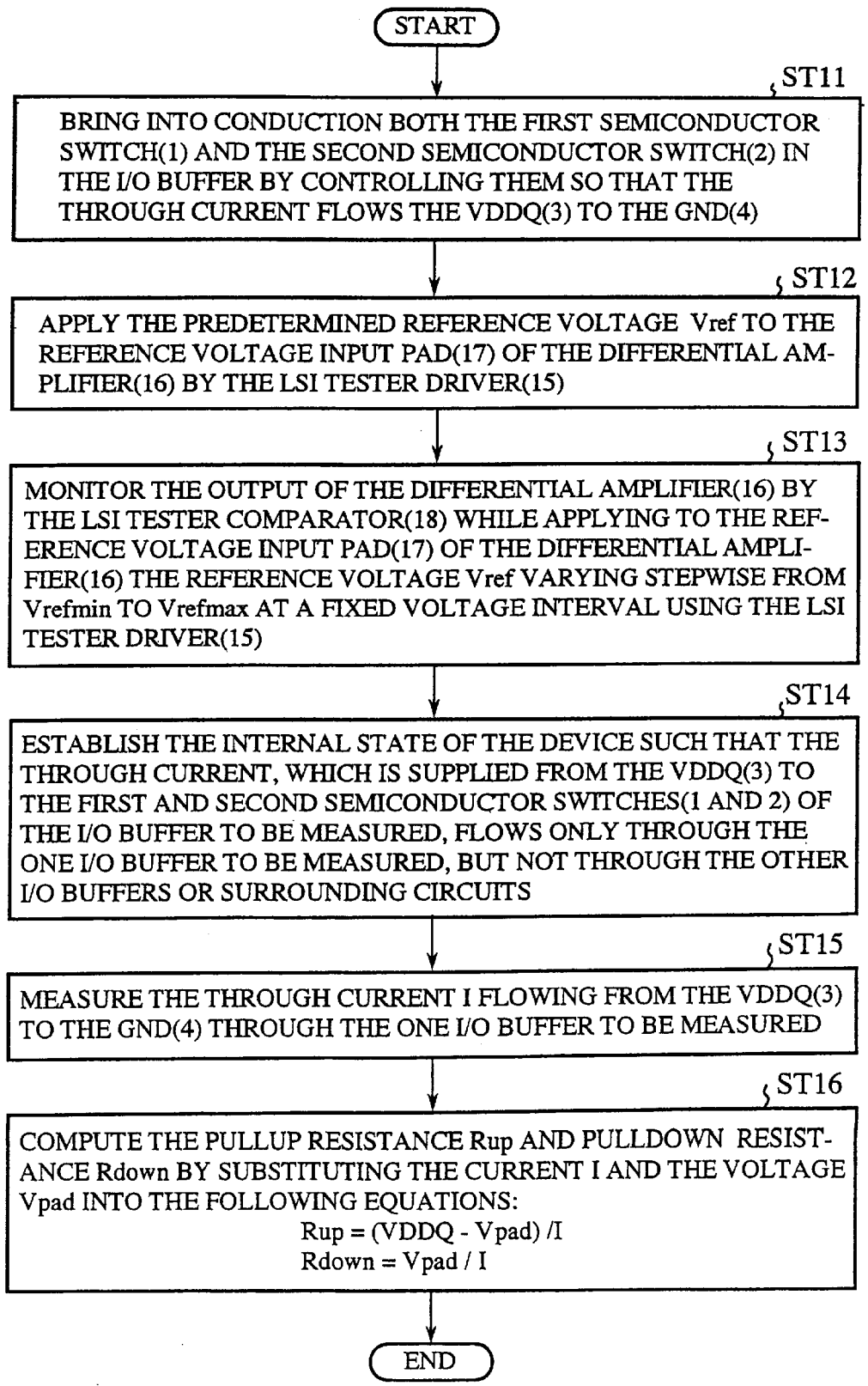
FIG. 7 is a flowchart illustrating the measuring operation of the embodiment 3.

Next, the operation of the present embodiment 3 will be described with reference to the flowchart of FIG. 7.

At step ST11, a through current is caused to flow from the device power supply 3 to the ground 4 by bringing the transistors 1 and 2 into conduction by the signals delivered from the measuring circuit 5 in response to the control signals fed from the control circuit 6.

Subsequently, at step ST12, the reference voltage Vref is applied from the test driver 15 to the reference voltage input pad 17 of the differential amplifier 16.

With applying the reference voltage Vref from the test driver 15 to the reference voltage input pad 17 of the differential amplifier 16, the tester comparator 18 monitors the output of the differential amplifier 16. Thus, the voltage Vpad when the output of the differential amplifier 16 is inverted is stored as a measured result at step ST13. This inversion occurs when the reference voltage Vref crosses the voltage appearing at the connecting point 10 while varying the reference voltage in the range from Vrefmin to Vrefmax.

Subsequently, at step ST14, the internal state of the measuring circuit 5 is set such that the through current flowing out of the device power supply 3 and through the transistors 1 and 2 does not flow through circuits other the circuit to be measured.

In this state, at step ST15, the ammeter 12 is connected between the device power supply 3 and the series circuit of the transistors 1 and 2 to measure the through current.

Afterward, at step ST16, the current I and the voltage Vpad thus measured are substituted into equations (1) to compute the pullup resistance Rup, and pulldown resistance Rdown.

According to the present embodiment 3, since the voltage is measured utilizing the differential amplifier 16 included in the bidirectional buffer, the voltmeter for measuring the voltage can be obviated.

EMBODIMENT 4

Figure 4:
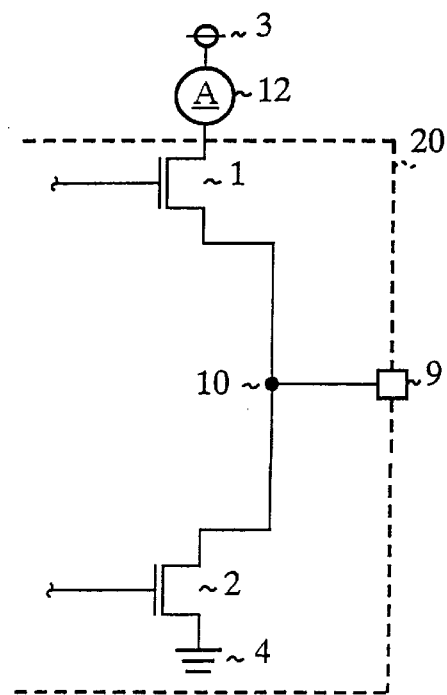
FIG. 4 is a circuit diagram illustrating a current measurement.
Figure 8:
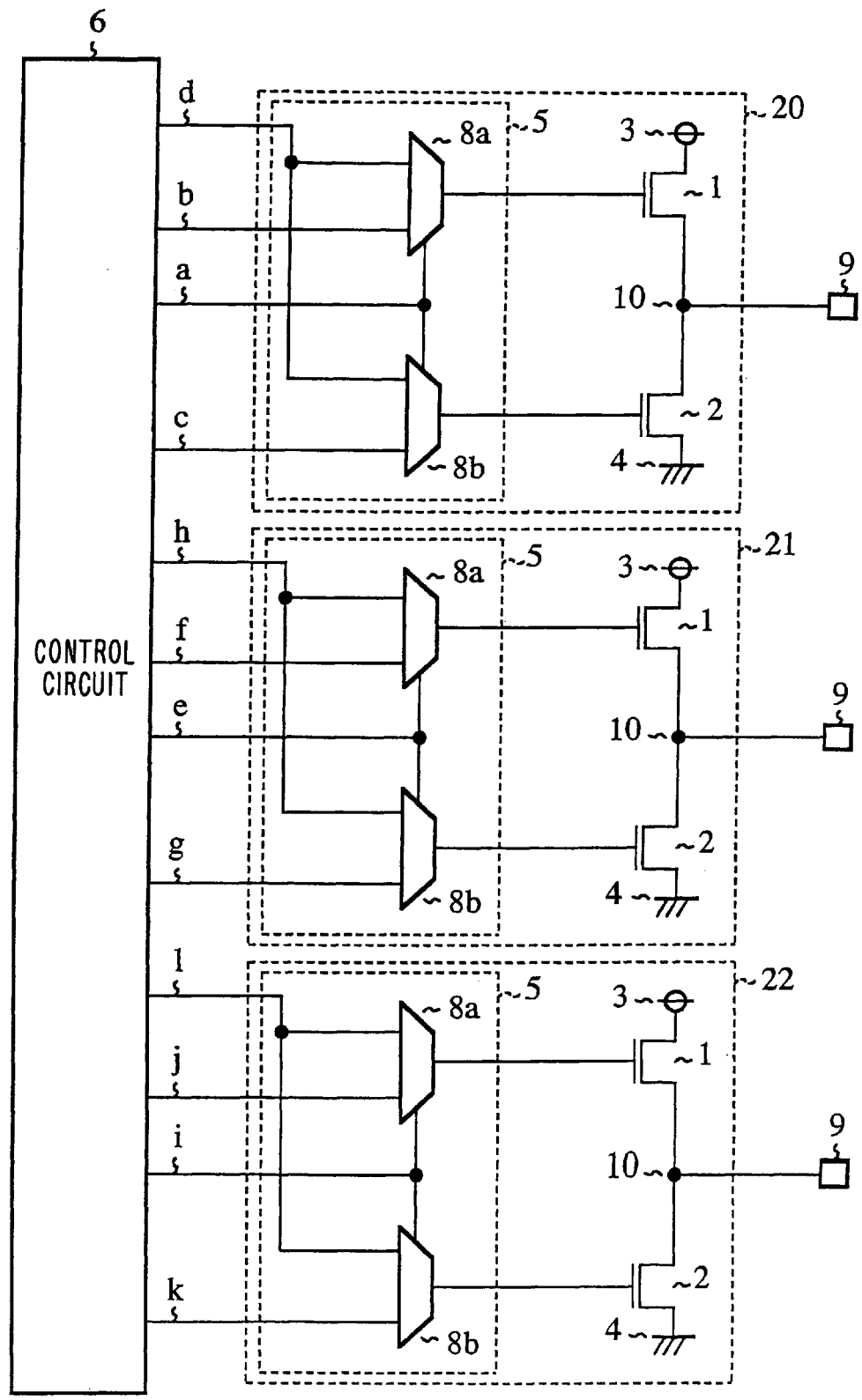
FIG. 8 is a circuit diagram showing an embodiment 4 of the fast, small signal input/output buffer in accordance with the present invention.

FIG. 8 is a circuit diagram showing an embodiment 4 of the fast, small signal input/output buffer in accordance with the present invention. In FIG. 8, the reference numerals 20–22 each designate a fast, small signal input/output buffer of the same configuration, which are connected to the measuring circuit 5. The configuration of each fast, small signal input/output buffer is the same as that of the embodiment 2 as shown in FIG. 4, and hence the description thereof is omitted here by designating the like portions by the same reference numerals.

Figure 9:
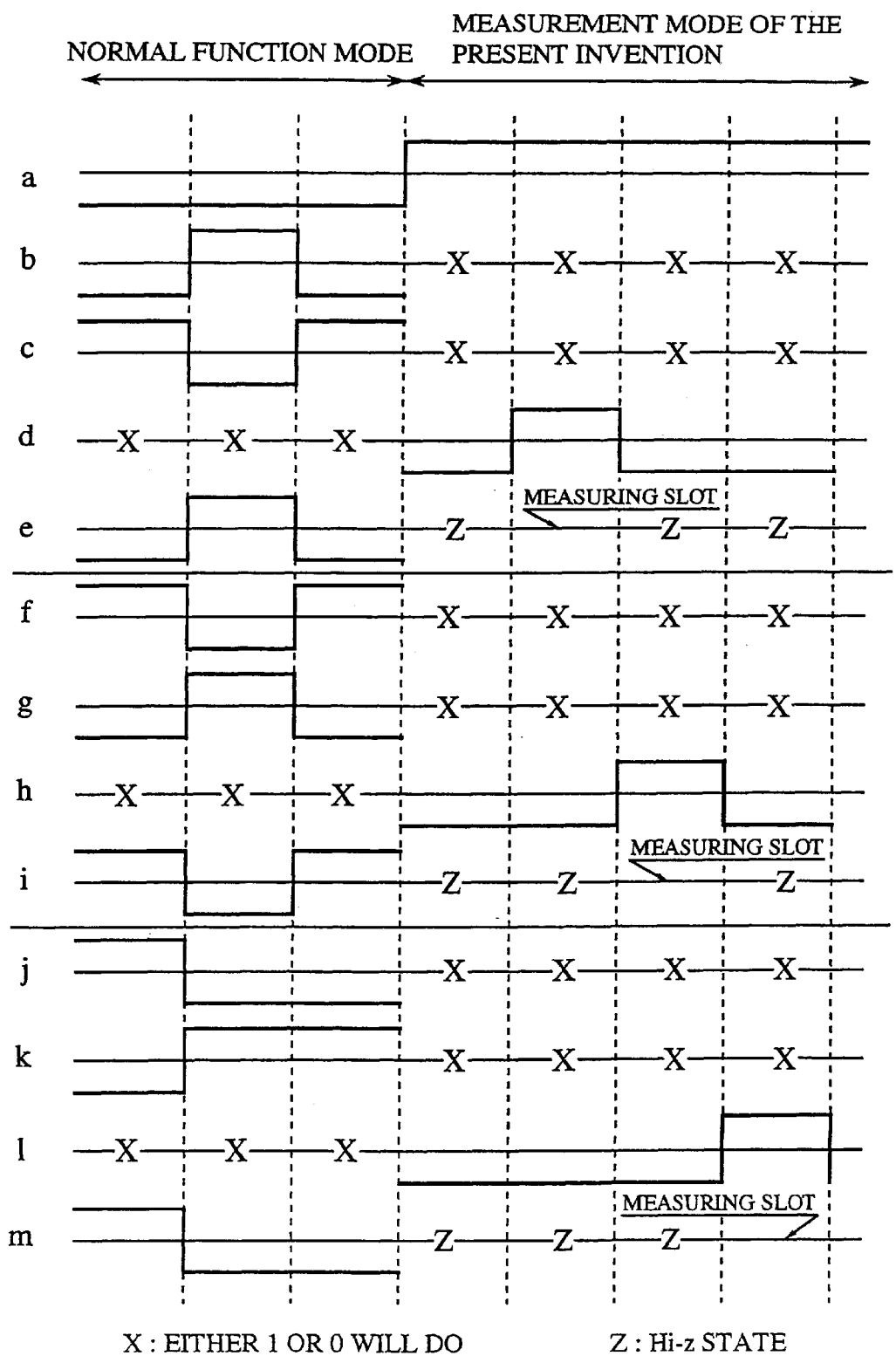
FIG. 9 is a timing chart illustrating the measuring operation of the embodiment 4 of the fast, small signal input/output buffer.
Figure 10:
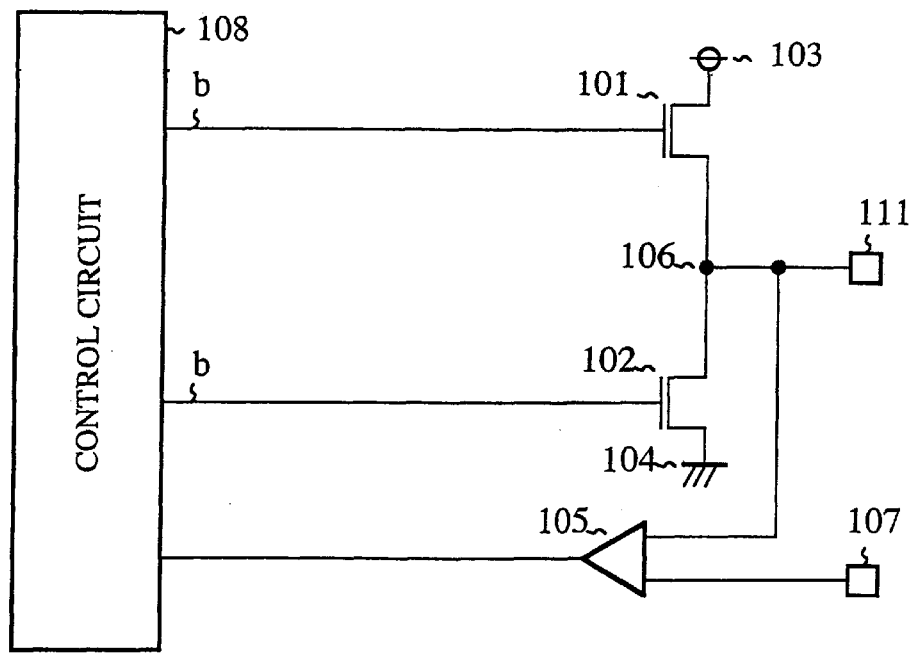
FIG. 10 is a circuit diagram showing a conventional fast, small signal input/output buffer.
Figure 11:
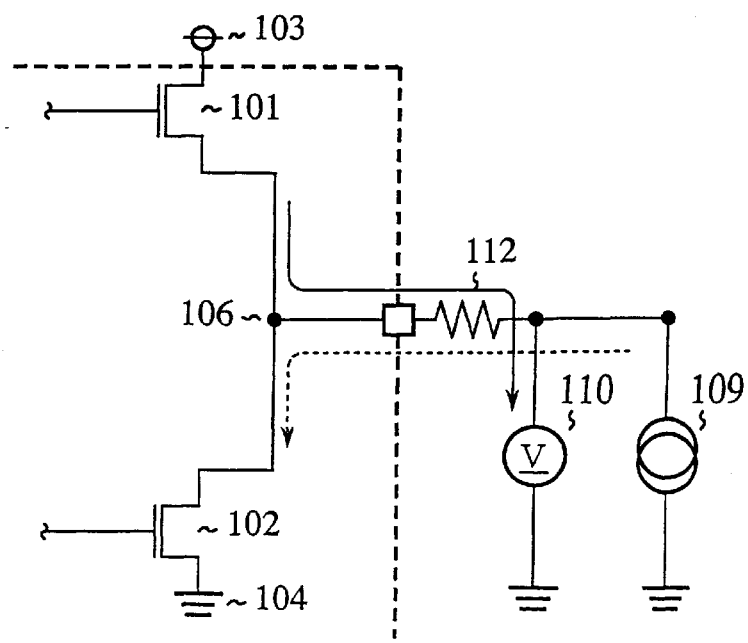
FIG. 11 is a circuit diagram illustrating a measurement of the circuit of FIG. 10.

FIG. 9 is a timing chart illustrating the operation of the present embodiment 4 of the fast, small signal input/output buffer. The measurement is carried out sequentially for the individual fast, small signal input/output buffers at measuring slots indicated in FIG. 9. In this case, the signals needed for causing the through current to flow are prevented from being supplied from the measuring circuit 5 to the fast, small signal input/output buffers not to be measured. Thus, the state can be established in which the through current flows only through the fast, small signal input/output buffer to be measured, but not through the circuits other than the circuit to be measured.

Incidentally, the alphabetical symbols affixed to the input lines to the measuring circuit 5 in the foregoing embodiments indicate that the corresponding signals in the timing chart of FIG. 9 are supplied from the control circuit 6 to the measuring circuit 5.

What is claimed is:

1. A test method of a semiconductor circuit comprising the steps of:

causing a through current to flow through a first semiconductor switch functioning as a pullup resistor and a second semiconductor switch functioning as a pulldown resistor, said first semiconductor switch and said second semiconductor switch being connected in series across a power supply and a ground in a circuit to be measured;

measuring an open circuit voltage at a connecting point of said first semiconductor switch and said second semiconductor switch; and measuring the through current in a state that no current flows through circuits other than said circuit to be measured.

2. The test method as claimed in claim 1, further comprising the step of computing values of said pullup resistor and said pulldown resistor from said open circuit voltage and said through current.

3. A test device of a semiconductor circuit comprising:

a first semiconductor switch functioning as a pullup resistor;

a second semiconductor switch functioning as a pulldown resistor, said first semiconductor switch and said second semiconductor switch being connected in series across a power supply and a ground in a circuit to be measured;

means for bringing into conduction said first semiconductor switch and said second semiconductor switch at a same time;

means for measuring an open circuit voltage at a connecting point of said first semiconductor switch and said second semiconductor switch; and means for measuring a through current flowing through said first semiconductor switch and said second semiconductor switch.

4. The test device as claimed in claim 3, further comprising means for computing values of said pullup resistor and said pulldown resistor from said open circuit voltage and said through current.

5. The test device as claimed in claim 4, wherein said first semiconductor switch and said second semiconductor switch have different conductivity types.

6. The test device as claimed in claim 4, wherein said first semiconductor switch and said second semiconductor switch have an identical conductivity type.

7. The test device as claimed in claim 4, further comprising means for generating a reference voltage varying stepwise, wherein said means for measuring an open circuit voltage comprises a differential amplifier for comparing the reference voltage with the voltage at the connecting point of said first semiconductor switch and said second semiconductor switch, and means for storing the reference voltage when an output of said differential amplifier is inverted.

8. A test device of a semiconductor circuit which includes a plurality of circuits to be measured, each of said plurality of circuits to be measured comprising:

a first semiconductor switch functioning as a pullup resistor;

a second semiconductor switch functioning as a pulldown resistor, said first semiconductor switch and said second semiconductor switch being connected in series across a power supply and a ground in a circuit to be measured;

means for bringing into conduction said first semiconductor switch and said second semiconductor switch at a same time;

means for measuring an open circuit voltage at a connecting point of said first semiconductor switch and said second semiconductor switch; and means for measuring a through current flowing through said first semiconductor switch and said second semiconductor switch, wherein said test device further comprises means for sequentially providing each one of said plurality of circuits to be measured with a signal activating said means for bringing into conduction, and means for computing values of said pullup resistor and said pulldown resistor of each of said plurality of circuits to be measured from said open circuit voltage and said through current.

9. The test device as claimed in claim 8, wherein said first semiconductor switch and said second semiconductor switch have different conductivity types.

10. The test device as claimed in claim 8, wherein said first semiconductor switch and said second semiconductor switch have an identical conductivity type.

11. The test device as claimed in claim 8, further comprising means for generating a reference voltage varying stepwise, wherein said means for measuring an open circuit voltage comprises a differential amplifier for comparing the reference voltage with the voltage at the connecting point of said first semiconductor switch and said second semiconductor switch, and wherein said test device further comprises means for storing the reference voltage when an output of said differential amplifier is inverted.

12. A semiconductor circuit comprising:

a first transistor connected between a power supply and an output node;

a second transistor connected between a ground and the output node;

an output pad connected to the output node;

a first selector receiving a first set of two control signals, for selectively outputting a one of the first set of two control signals to said first transistor in response to a first selection signal;

a second selector receiving a second set of two control signals, for selectively outputting a one of the second set of two control signals to said second transistor in response to a second selection signal; and a control circuit for outputting the first selection signal and a first control signal, which comprises one of the first set of two control signals, to said first selector, and outputting the second selection signal and a second control signal, which comprises one of the second set of two control signals, to said second selector, said control circuit controlling the first and second selectors to supply the first and second control signals to said first and second transistor, respectively, said first and second transistor being brought into conduction simultaneously in response to the first and second control signals to cause a through current to flow between the power supply and the ground.

13. The semiconductor circuit according to claim 12, further comprising:

an input pad;

another output pad; and a differential amplifier having a first input connected to the output node and a second input connected to said input pad and a output connected to said another output pad.

14. A semiconductor circuit comprising:

a plurality of buffers each including a first transistor connected between a power supply and an output node and a second transistor connected between a ground an the output node;

a plurality of output pads provided to correspond to said plurality of buffers, each output pad being connected to the output node for the corresponding buffer; and a control circuit for outputting control signals to said plurality of buffers, said plurality of buffers being controlled by the control signals so that the first and second transistors of a selected one of said plurality of buffers are brought into conduction simultaneously to cause a through current to flow between the power supply and the ground while a through current is prevented from flowing between the power supply through the first and second transistors of the buffers other than the selected one.

15. The semiconductor circuit according to claim 14, wherein the control signals include activating signals sequentially applied to said plurality of buffers, the first and second transistors of each buffer are brought into conduction simultaneously in response to one of the activating signals to cause a through current to flow between the power supply and the ground.

* * * * *

UNITED STATES PATENT AND TRADEMARK OFFICE
CERTIFICATE OF CORRECTION

PATENT NO. : 6,150,831 Page 1 of 1
DATED : November 21, 2000
INVENTOR(S) : Miko Asai et al.

It is certified that error appears in the above-identified patent and that said Letters Patent is hereby corrected as shown below:

Figure 8, delete "e" and insert -- a --, delete "i" and insert -- a --.

Signed and Sealed this

Twenty-fifth Day of December, 2001

Attest:

Attesting Officer

JAMES E. ROGAN
*Director of the United States Patent and Trademark Office*